Figure 1:
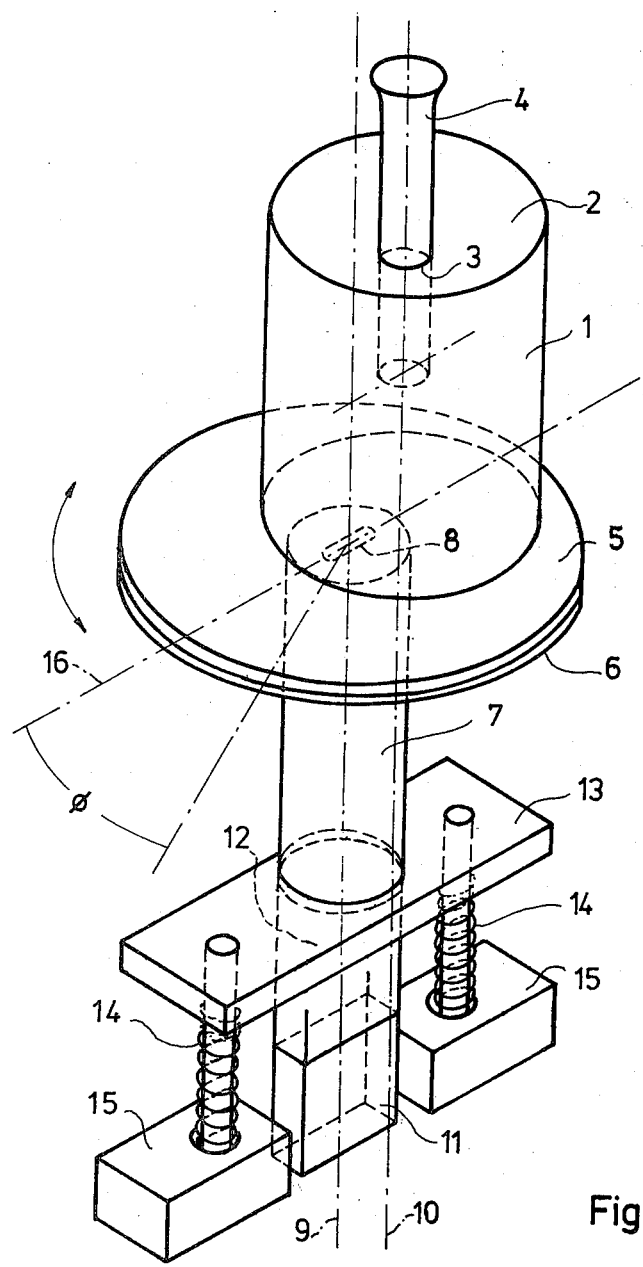

United States Patent [19]

Biehl et al.

[11] 4,399,406
[45] Aug. 16, 1983

[54] TEST HEAD FOR ELECTRON SPIN RESONANCE AND PARAMAGNETIC ELECTRON RESONANCE MEASUREMENTS

[75] Inventors: Reinhard Biehl, Karlsruhe; Dieter Schmalbein, Marxzell-Burbach, both of Fed. Rep. of Germany

[73] Assignee: Bruker Analytische MeBtechnik GmbH, Silberstreifen, Fed. Rep. of Germany

[21] Appl. No.: 271,865

[22] Filed: Jun. 9, 1981

[30] Foreign Application Priority Data

Jun. 14, 1980 [DE] Fed. Rep. of Germany ....... 3022481

[51] Int. Cl.$^3$ .......................................... G01R 33/08
[52] U.S. Cl. ..................................... 324/316; 324/318
[58] Field of Search ........................ 324/300, 316, 318

[56] References Cited

U.S. PATENT DOCUMENTS 4,314,204 2/1982 Biehl et al. .......................... 324/316

Primary Examiner—Michael J. Tokar
Attorney, Agent, or Firm—William D. Hall

[57] ABSTRACT

A test head for electron spin resonance and paramagnetic electron resonance measurements comprises a resonator of circular cylindrical shape adapted to accommodate a coaxially arranged test tube, and a waveguide arrangement for exciting the $H_{011}$ wave in the resonator, said waveguide arrangement comprising one section having its one end arranged adjacent one face of the resonator and communicating with the resonator via an opening provided in the face in eccentrical arrangement relative to the resonator. In order to enable the coupling coefficient to be varied and, thus, the resonator to be adapted to the waveguide section, the waveguide section carrying a $H_{1n}$ wave communicates with the resonator via a coupling slot the angular position ($\phi$) of which can be varied relative to the radial plane of the resonator passing through its center. Preferably, the waveguide section exhibits a circular cross-section and can be rotated about its axis. It guides the $H_{11}$ wave, and the coupling slot is provided, symmetrically relative to the axis of the waveguide section, in a wall portion connected to the said waveguide section.

8 Claims, 4 Drawing Figures

TEST HEAD FOR ELECTRON SPIN RESONANCE AND PARAMAGNETIC ELECTRON RESONANCE MEASUREMENTS

The present invention relates to a test head for electron spin resonance and paramagnetic electron resonance measurements comprising a resonator of circular cylindrical shape adapted to accommodate a coaxially arranged test tube, and a waveguide arrangement for exciting the $H_{011}$ wave in the resonator, said waveguide arrangement comprising one section having its one end arranged adjacent one face of the resonator and communicating with the resonator via an opening provided in the face in excentrical arrangement relative to the resonator.

Spectrometers adapted for electron spin resonance and paramagnetic electron resonance measurements operate at frequencies above 24 GHz and are designed for continuous operation as reflexion spectrometers. In this arrangement, the resonator which is tuned to resonance forms a terminal resistance which is adapted as precisely as possible to the wave resistance of the waveguide arrangement. If an electron spin resonance or a paramagnetic electron resonance is encountered in the sample introduced into the resonator, at the applied HF signal, the sample absorbs energy which varies the resistance of the resonator and interferes with the matching to the wave resistance of the waveguide arrangement. This in turn produces a mismatch which leads to a reflexion of the HF signal at the resonator. And these reflexions finally are measured for determining the resonances.

Therefore, it was necessary in the operation of such a spectrometer to not only match the resonator with the sample inserted therein to the frequency of the HF signal used as exciting signal, but also to match the resistance as precisely as possible under the given conditions to a waveguide arrangement. The resistance of the waveguide resonator tuned to resonance does, however, not only depend on the losses of the sample which is not in tune, but also on the operating temperature of the resonator, because the conductivity of the resonator and, therefore, its quality varies as the temperature changes. Considering that such resonance measurements are carried out in a temperature range of approx. 4 to 350 K, the resistance of the tuned resonator may be subject to considerable variations. But in practical applications, it is a particular requirement to have the possibility to match the resonator impedance precisely even at low temperatures.

In the test heads known heretofore (cf., for instance, Rev. Sci. Instrum., vol. 27, 1956, pages 596 to 605, and Poole, Jr., Charles P., Electron Spin Resonance, A Comprehensive Treatise on Experimental Techniques, New York, London, Sydney 1967, pages 289, 290) the waveguide arranged adjacent to the face wall was coupled to the resonator via a circular bore which by its size and position defined the invariable coupling coefficient in each individual case. In order to make the coupling coefficient variable, arrangements have also been provided in which a cone-shaped lug of a dielectric material, with a metal pin having the function of an antenna coaxially arranged therein, projected from the side of the waveguide into the opening. The cone was arranged in the waveguide section to slide in its longitudinal direction so that the coupling coefficient could be varied by displacing the cone together with the antenna included therein. The disadvantage of this arrangement is to be seen in the fact that the coupling arrangement is not free of interfering reactances preventing any absolute matching of the resonator resistance, and that in addition the tuning element arranged immediately adjacent the resonator is not freely accessible from the outside, so that in particular in the case of extremely low temperatures it is no longer possible to match the resonator resistance to the waveguide arrangement.

Now, it is the object of the present invention to improve a test head of the type described above so that matching of the resonator resistance to the wave resistance of the waveguide arrangement will be possible over a very wide range of different resonator resistances and that such matching will be possible even in cases where the resonator and the sample have cooled down to extremely low temperatures.

According to the invention, this problem is solved in that the waveguide section carrying a $H_{1n}$ wave communicates with the resonator via a coupling slot the angular position of which can be varied relative to the radial plane of the resonator passing through its centre.

Considering that the magnetic flux lines of the $H_{011}$ wave follow a radial path, maximum coupling between the waveguide section and the resonator is achieved when the coupling slot is also radially directed. If, however, the coupling slot occupies a position vertical to the radial magnetic flux lines, minimum coupling is obtained between the waveguide section and the resonator. So, extremely different coupling coefficients can be obtained to permit matching within a very broad range, simply by turning the coupling slot. A rotatable screen which permits the desired displacement of the coupling slot can be realized in a simple manner and easily connected, for instance by means of a simple drive shaft, with a drive that may be located in a cool area, so that the necessary adjustments can be made even if the test head is situated in cold surroundings. Further, the adjustment of the position of the coupling slot and, thus, matching of the resonator, is possible at any time during operation so that necessary adjustments and corrections can be made at any desired moment.

Preferably, the coupling slot is positioned at a point relative to the resonator where the highest current density is encountered in the face wall of the resonator. With given dimensions of the coupling slot, this position is the one where maximum coupling and maximum variation of coupling are obtained.

In a preferred embodiment of the invention, the coupling slot is provided in a wall portion connected to the waveguide section, in symmetrical relation to the axis of the said waveguide section which exhibits a circular cross-section and which guides the $H_{11}$ wave, and the waveguide section can be rotated about its axis relative to the resonator. Such an arrangement is particularly advantageous as regards the mechanical structure of the test head, because a waveguide section of circular cross-section lends itself well for being rotatably seated and because, moreover, the wall portion connected to the said waveguide which is part of the face wall of the resonator need not be in electric contact with the adjacent wall portion as the $H_{011}$ wave encountered in the resonator allows only ring-shaped currents to flow concentrically to the resonator axis. This makes it even possible to give the wall portion which simultaneously forms the face wall of the resonator the form of a dielectric plate with a thin metal coating applied to its side facing the waveguide section. Due to the fact that this dielectric plate is fixed to the waveguide section, the metal coating may also be conductively connected to the wall of the said waveguide section, while the shell of the resonator rests on the un-coated side of the dielectric plate. The gap thus formed at the end of the resonator remains without influence, for the reasons outlined before. Also, the dielectric material of the plate does not have any negative effects at this position in the resonator because the intensity of the electric field drops to zero at this point. At the same time, this embodiment makes it possible to select for the dielectric plate a material having good sliding properties which will offer no significant resistance to the relative movement between the resonator and the plate during rotation of the coupling gap. Preferably, the plate may be made from glass-fibre reinforced polytetrafluor ethylene.

A further improvement of the invention provides that the waveguide section may be connected to a coaxial rectangular waveguide via a $H_{10}$–$H_{11}$ adaptor. When the waveguide section carrying the $H_{11}$ wave can be rotated in the manner described above, it may be rotatable also relative to the end of the $H_{10}$–$H_{11}$ adaptor. In any case, the polarization of the $H_{11}$ wave in the waveguide section is determined by the alignment of the rectangular waveguide in which the magnetic flux lines follow a path parallel to its broad side. The rotation of the coupling slot, perhaps combined with the rotation of the waveguide section, has no influence on the polarization of the $H_{11}$ wave in this waveguide section. Accordingly, any rotation of the coupling slot will vary also the coupling to the $H_{11}$ wave. To ensure maximum coupling to the $H_{11}$ wave when maximum coupling to the resonator is given, the broad sides of the rectangular waveguide should advantageously extend in parallel to the radial plane of the resonator extending through the centre of the coupling slot.

In order to ensure that the components of the test head that can be rotated relative to each other will move free from play throughout the very broad range of possible operating temperatures, a preferred embodiment of the invention provides an arrangement in which these components which can be rotated relative to each other, are resiliently urged against each other in the axial direction.

Further details and improvements of the invention will be apparent from the following description of the embodiment shown by way of example in the attached drawing. It goes without saying that the features apparent from the drawing and the specification may be used also in other embodiments of the invention, either alone or in any desired combination.

In the drawing

Figure 4:
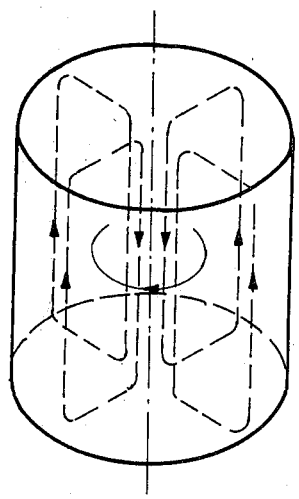
Figure 3:
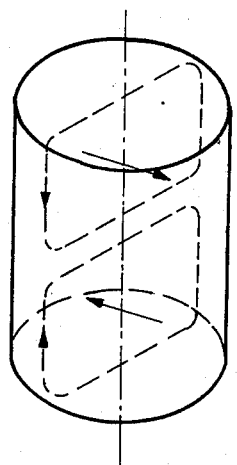
Figure 2:
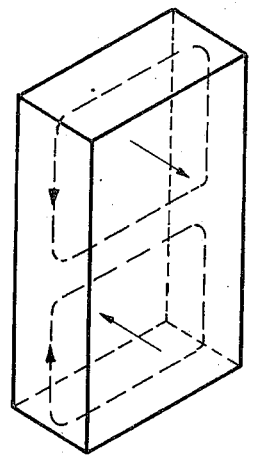

FIG. 1 shows a diagrammatic representation of a test head in accordance with the invention; and FIGS. 2 to 4 show diagrams of the field configurations in the individual components of the test head of FIG. 1.

The test head shown in FIG. 1 comprises a resonator 1 of circular cylindrical cross-section, with a central bore 3 provided in its upper face 2 for the introduction of the test tube 4. The upper face 2 of the resonator 1 may be formed in a manner known as such which is therefore not shown in the drawing, by a frequency-tuning plunger.

At the bottom, the resonator 1 is closed by a dielectric plate 5 which in the embodiment shown in the drawing has a thickness of approx. 0.2 mm and consists of glass-fibre reinforced polytetrafluor ethylene. This plate is coated on its side facing away from the resonator 1 with a metal layer 6 which may have a thickness of approx. 0.02 mm. Mounted to the lower face of the dielectric plate 5 is a waveguide section 7 of cylindrical cross-section which is conductively connected to the metal coating 6 of the bottom face of the plate 5. The plate 5 and the waveguide section 7 are provided in concentrical relation relative to each other. The metal coating 6 of the plate 5 has an opening in the form of a coupling slot 8 provided in concentrical relation to the waveguide section 7. The axis 9 of the waveguide section is displaced relative to the axis 10 of the resonator by an amount such that the axis 9 extends through the resonator 1 at the point of maximum density of the current in the side walls of the resonator 1.

The waveguide section 7 is supplied from a rectangular waveguide 11, via an adaptor 12 arranged between the rectangular waveguide 11 and the waveguide section 7 of circular cross-section. The waveguide section 7 can be rotated relative to the adjacent end of the adaptor 12 which is likewise circular in cross-section. The rectangular waveguide 11, together with the adjacent adaptor 12, can be moved within certain limits in the axial direction. The end of the adaptor 12 is held by a bridge 13 which in turn is supported by fixed abutments 15 via spiral compression springs 14. Thus, the adaptor is resiliently urged against the rotatable waveguide section 7, while the latter is resiliently urged, together with its plate 5, towards the resonator 1. This ensures on the one hand relative movement between the individual components of the test head, which are free from play, and avoids on the other hand any risk for the components of getting jammed due to dimensional variations caused by temperature changes. The rotational movement of the waveguide section 7 and the plate 5 may be ensured by providing either the waveguide section or the plate with a toothed rim engaging a pinion seated on a drive shaft. There exist so many different possibilities of designing a suitable drive mechanism that this detail has been voluntarily omitted in the diagrammatic representation of the test head in FIG. 1.

In operation, a $H_{10}$ wave is excited in the rectangular waveguide 11. The flux lines of the said $H_{10}$ wave are diagrammatically shown in FIG. 2 wherein the dashed lines represent the magnetic flux lines while the solid lines represent the electric field, the arrows indicating in each case the directional sense of the fields. The $H_{10}$ wave is transformed by the adaptor 12 into the $H_{11}$ wave whose field configuration is shown in FIG. 3. It appears that the field configuration of the $H_{11}$ wave in the circular waveguide is substantially identical to the field configuration of the $H_{10}$ wave in the rectangular waveguide. More particularly, the polarization of the $H_{11}$ wave in the circular waveguide is parallel to the broad sides of the rectangular waveguide 11. The arrangement of the rectangular waveguide 11 is such that the polarization plane of the $H_{11}$ wave coincides with the radial plane 16 of the resonator 1 passing through the axis 9 of the rectangular waveguide 11 and of the circular waveguide section 7.

In FIG. 1, the coupling slot 8 occupies a position in which its longitudinal axis coincides with the said radial plane 16 and, thus, with the polarization plane of the $H_{11}$ wave, so that maximum coupling with this wave is obtained. The design of the resonator is such that it is tuned in at the operating frequency selected for the $H_{11}$ wave. As shown in FIG. 4, the $H_{011}$ wave has a radially disposed magnetic field to which the coupling slot 8 is likewise maximally coupled in the position shown in the drawing. So, maximum coupling $k_1$ between the waveguide 7 and the resonator 1 is obtained in this position.

Now, when coupling slot 8 is rotated about the axis 9 by turning the waveguide section 7 together with the plate 5, an angle $\phi$ is formed between the coupling slot 8 and the field of the $H_{11}$ wave in the waveguide section 7 on the one hand and the radial field lines of the $H_{011}$ wave in the resonator 1 on the other hand. As the amount of this angle $\phi$ increases, the coupling coefficient drops until upon completion of a rotational movement by 90°, i.e. when the slot 8, viewed in its longitudinal direction, extends vertically to the radial plane 16, coupling is reduced to a residual value $k_0$. The metal coating 6 separating the resonator 1 and the waveguide section 7 being extremely thin, its influence may be regarded as negligible so that the following formula applicable to coupling slots in infinitely thin plates can be used for determining the value of k:

$$k = k_0 + k_1 \cdot \cos^2 \phi.$$

Accordingly, the coupling coefficient depends on the angle $\phi$ formed between the line of orientation of the coupling slot and the radial plane passing through its centre. The volume range is defined as $$D = (k_1 - k_0)/k_0.$$

In an experimental test head designed in accordance with the invention, the volume range D of approx. 400 could be achieved. Within this extremely wide range, the value k can be consistently adjusted to any desired value, with high accuracy, in view of the above-described strict dependence between the coupling and the angular position $\phi$ of the coupling slot. The values $k_0$ and $k_1$ can be calibrated for $\phi = 0°$ and $\phi = 90°$. The value of $k_0$ depends substantially exclusively on the length-to-width relation of the coupling slot.

The invention has been described above with reference to one example represented in diagrammatic form only. Any details regarding the constructional design have been intentionally omitted in the description as many different possibilities are available to the man of the art in this respect. This applies to the means of seating and driving the movable parts as well as to the arrangement of springs for urging the individual components against each other. For instance, the two diagrammatically shown spiral compression springs 14 could be replaced by one single spiral compression spring encircling the whole waveguide arrangement. Further, the waveguide section 7 could also be provided with an end wall rotatably seated within the bottom of the resonator 1, although in this case appropriate steps would have to be taken to ensure perfect contact between this endplate and the remaining portion of the resonator bottom. The arrangement described above offers the advantage that the $H_{011}$ wave in the resonator 1 does not comprise any currents passing from the shell to the end faces so that no contact is required between the shell faces and the end faces of the resonator and the metal coating 6 forming the end face of the resonator 1 may be separated from the cylinder wall of the resonator 1.

What we claim is:

1. A test head for electron spin resonance and paramagnetic electron resonance measurements comprising a resonator of circular cylindrical shape adapted to accommodate a coaxially arranged test tube, and a waveguide arrangement for exciting the $H_{011}$ wave in the resonator, said waveguide arrangement comprising one section having its one end arranged adjacent one face of the resonator and communicating with the resonator via an opening provided in the face in eccentrical arrangement relative to the resonator, characterized in that the waveguide section carrying a $H_{1n}$ wave communicates with the resonator via a coupling slot the angular position ($\phi$) of which can be varied relative to the radial plane of the resonator passing through its centre.

2. A test head in accordance with claim 1, characterized in that the coupling slot is positioned at a point relative to the resonator where the highest current density is encountered in the face wall of the resonator.

3. A test head in accordance with claim 1, characterized in that the waveguide section is of circular cross-section and carries the $H_{11}$ wave, that the coupling slot is provided, in symmetrical relation to the axis of the waveguide section, in a wall portion connected to the said waveguide section, and that the waveguide section can be rotated about its axis relative to the resonator.

4. A test head in accordance with claim 3, characterized in that the wall portion forming simultaneously the end portion of the resonator is formed by a dielectric plate with a thin metal coating provided on its side facing the waveguide section.

5. A test head in accordance with claim 4, characterized in that the plate is made of glass-fibre reinforced polytetrafluor ethylene.

6. A test head in accordance with claim 3, characterized in that the waveguide section is connected to a coaxially arranged rectangular waveguide via a $H_{10}$–$H_{11}$ adaptor.

7. A test head in accordance with claim 6, characterized in that the broad sides of the rectangular waveguide extend in parallel to the radial plane of the resonator passing through the axis of the rectangular waveguide and of the waveguide section of circular cross-section.

8. A test head in accordance with claim 1, characterized in that its different components which can be rotated relative to each other are resiliently urged against each other in the axial direction.

* * * * *